United States Patent [19]
Ebbing et al.

[11] Patent Number: 6,155,773
[45] Date of Patent: *Dec. 5, 2000

[54] SUBSTRATE CLAMPING APPARATUS

[75] Inventors: Peter F. Ebbing, Los Altos; Satish Sundar, Mountain View, both of Calif.

[73] Assignee: Applied Materials, Inc., Santa Clara, Calif.

[*] Notice: This patent issued on a continued prosecution application filed under 37 CFR 1.53(d), and is subject to the twenty year patent term provisions of 35 U.S.C. 154(a)(2).

[21] Appl. No.: 08/935,293

[22] Filed: Sep. 22, 1997

[51] Int. Cl.⁷ .............................. B66C 23/00; B25J 15/00
[52] U.S. Cl. ................................. 414/744.5; 414/226.01; 414/226.05; 414/806; 414/808; 901/31; 901/39; 294/103.1; 294/87.1
[58] Field of Search ........................... 414/744.5, 222.12, 414/226.5, 806, 807, 808; 901/15, 30, 31, 36, 39; 294/103.1, 87.1

[56] References Cited

U.S. PATENT DOCUMENTS

| | | | |
|---|---|---|---|
| 4,586,743 | 5/1986 | Edwards et al. | 294/86.4 |
| 4,705,951 | 11/1987 | Layman et al. | 250/442.1 |
| 4,813,732 | 3/1989 | Klem | 294/103.1 |
| 5,022,695 | 6/1991 | Ayers . | |
| 5,046,909 | 9/1991 | Murdoch | 294/113 |
| 5,180,276 | 1/1993 | Hendrickson | 414/752 |
| 5,280,983 | 1/1994 | Maydan et al. | 294/119.1 |
| 5,324,155 | 6/1994 | Goodwin et al. . | |
| 5,374,147 | 12/1994 | Hiorki et al. | 414/217 |
| 5,469,035 | 11/1995 | Lowrance | 318/568.1 |
| 5,702,228 | 12/1997 | Tamai et al. | 414/744.5 |
| 5,720,590 | 2/1998 | Hofmeister | 901/15 X |
| 5,733,096 | 3/1998 | Van Duren et al. | 901/15 X |

FOREIGN PATENT DOCUMENTS

| | | |
|---|---|---|
| 0423608 A1 | 4/1991 | European Pat. Off. ........... B25J 9/12 |
| 0 445 651 A2 | 9/1991 | European Pat. Off. . |
| 0 793 262 A2 | 9/1997 | European Pat. Off. . |

*Primary Examiner*—Donald W. Underwood
*Attorney, Agent, or Firm*—Thomason, Moser & Patterson

[57] ABSTRACT

The present invention generally provides a robot that can transfer two workpieces, such as silicon wafers, simultaneously and at increased speeds and accelerations and decelerations. More particularly, the present invention provides a robot wrist associated with the robot arm for mechanically clamping a workpiece to a workpiece handling member attached to the arm. The wafer clamp selectively applies sufficient force to hold the workpiece and prevent slippage and damage to the workpiece during rapid rotation and linear movement of the handling member. In one embodiment, a clamp for securing silicon wafers uses two clamp fingers connected to a single flexure member to position and hold the wafer with minimal particle generation and wafer damage. The clamp is designed so that wafers are normally clamped except near fall extension of the workpiece handling member to deliver or pick up a wafer.

29 Claims, 8 Drawing Sheets

SUBSTRATE CLAMPING APPARATUS

BACKGROUND OF THE INVENTION

1. Field of the Invention

The present invention relates to a clamping mechanism that secures a workpiece to a mechanical arm. More particularly, the present invention relates to a clamp that gently secures a semiconductor wafer to a robot blade by biasing the wafer against a retaining member at the forward edge of the blade when the robot blade is at least partially retracted for rotation.

2. Background of the Related Art

Modem semiconductor processing systems include cluster tools which integrate a number of process chambers together in order to perform several sequential processing steps without removing the substrate from a highly controlled processing environment. These chambers may include, for example, degas chambers, substrate preconditioning chambers, cooldown chambers, transfer chambers, chemical vapor deposition chambers, physical vapor deposition chambers and etch chambers. The combination of chambers in a cluster tool, as well as the operating conditions and parameters under which those chambers are run, are selected to fabricate specific structures using a specific process recipe and process flow.

Once the cluster tool has been set up with a desired set of chambers and auxiliary equipment for performing certain process steps, the cluster tool will typically process a large number of substrates by continuously passing them through a series of chambers and process steps. The process recipes and sequences will typically be programmed into a microprocessor controller that will direct, control, and monitor the processing of each substrate through the cluster tool. Once an entire cassette of wafers has been successfully processed through the cluster tool, the cassette may be passed to yet another cluster tool or stand alone tool, such as a chemical mechanical polisher, for further processing.

Typical cluster tools process one substrate at a time by passing the substrates through a series of process chambers that are each designed to process a single substrate at a time. However, more recent designs have incorporated a parallel processing structure whereby two substrates are processed at a time. In these dual systems, the robot has a pair of spaced parallel blades that pass the wafers through a series of parallel processing chambers. Each of the processing chambers is constructed to accommodate and process two wafers at a time. In this way, throughput of substrates in the cluster tool is effectively doubled. The amount of time required by each process and handling step has a direct impact on the throughput of substrates per unit of time. Processes that require greater amounts of time to achieve the desired result may require that multiple chambers or tools be operated in parallel. On the other hand, processes that are completed in a short amount of time may be allowed to sit idle for brief periods, depending upon the economic considerations of cost of ownership and cost of operation. However, while the exact design of an integrated circuit fabrication system may be complex, it is almost always beneficial to perform each step as quickly as possible to maximize overall throughput without detrimentally affecting product quality, operating costs, or the life of the equipment. One exemplary fabrication system is the cluster tool shown in FIG. 1 which is shown in U.S. patent application Ser. No. 08/752,471, entitled "Dual Blade Robot," filed on Nov. 18, 1996, now U.S. Pat. No. 5,838,121, and is incorporated herein by reference.

Figure 1:
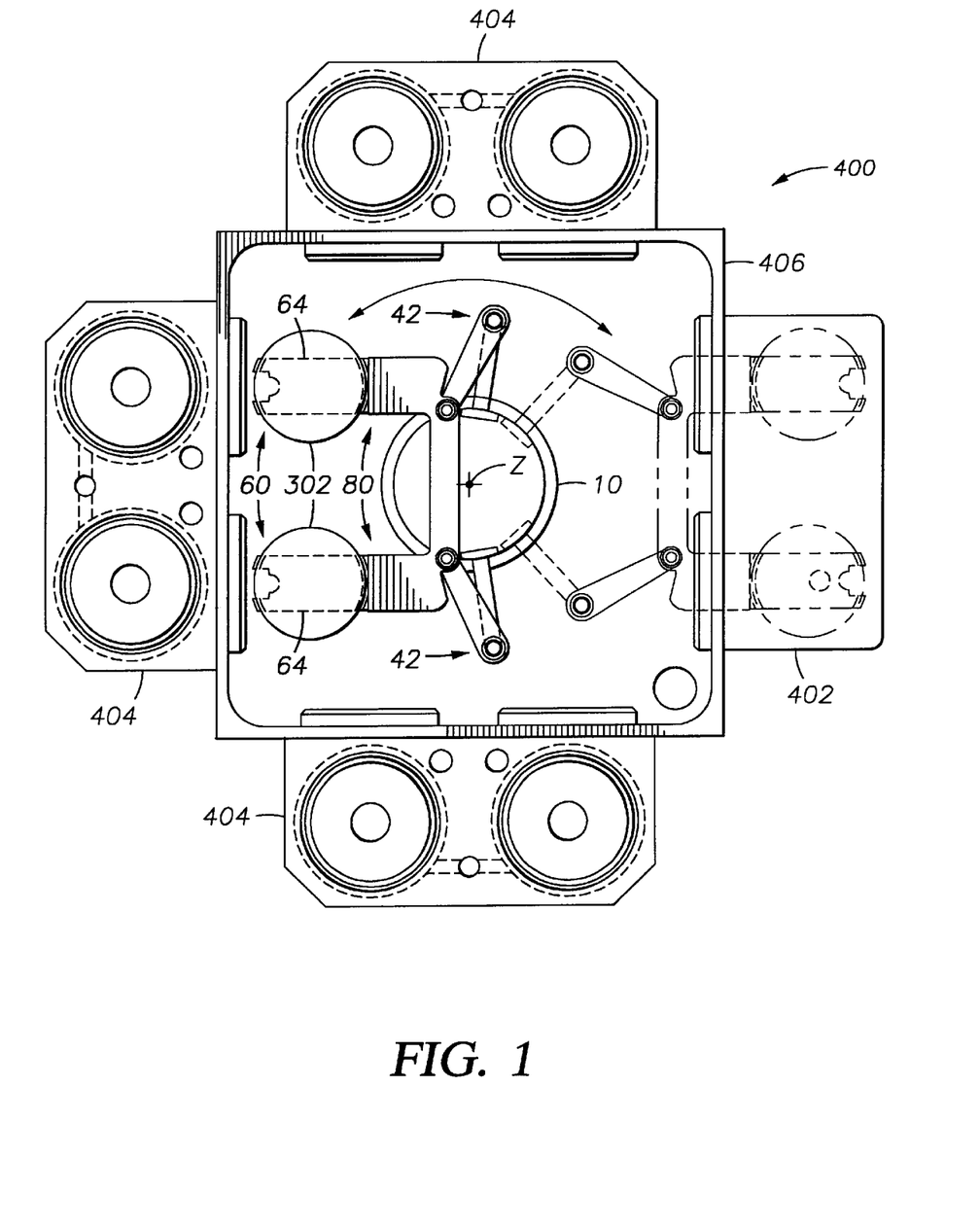
FIG. 1 is a top schematic view of a cluster tool having a robot for wafer handling.
Figure 2:
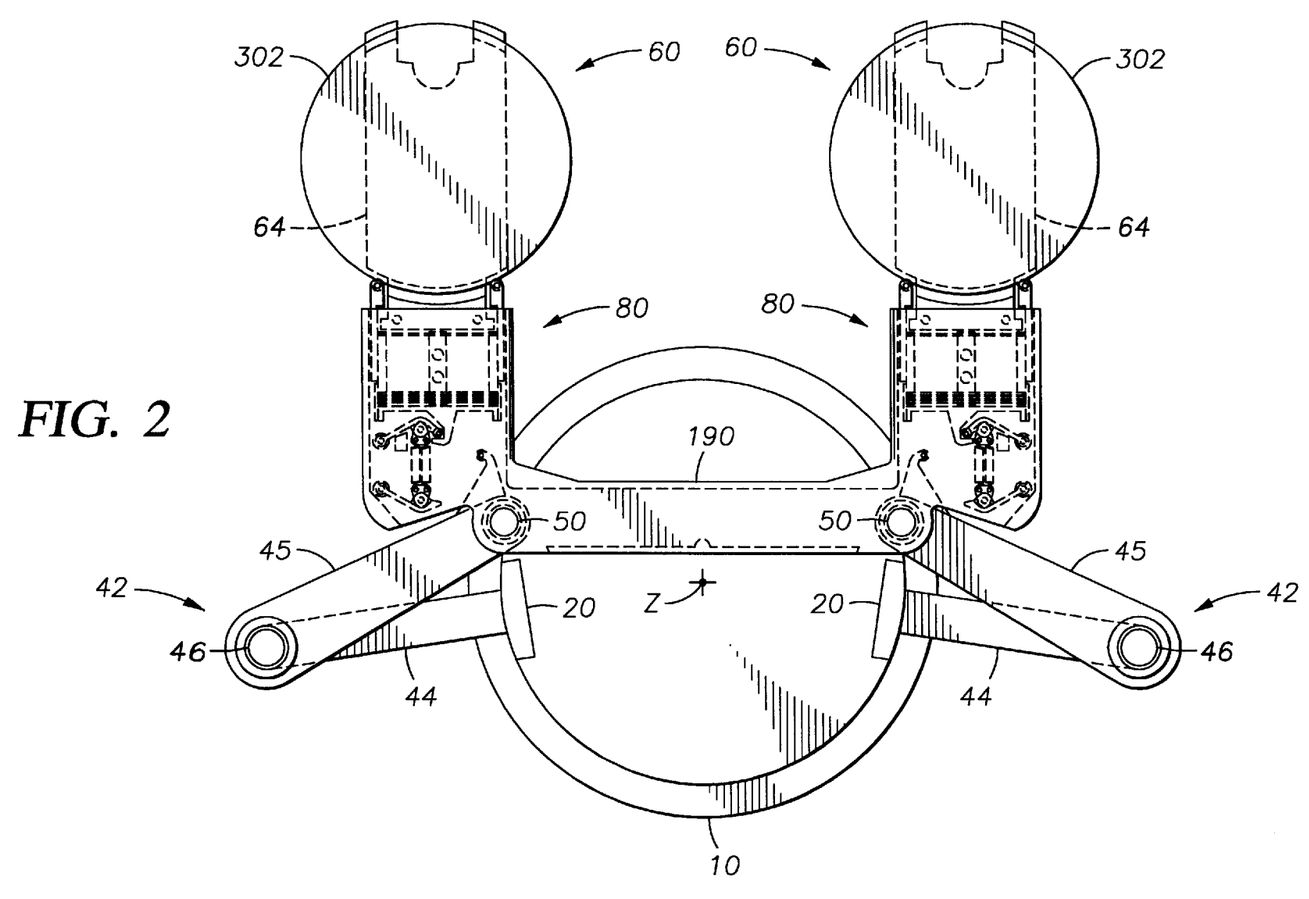
FIG. 2 is a top schematic view of a robot arm assembly of the present invention showing the clamping assembly in phantom.

Substrate throughput in a cluster tool can be improved by increasing the speed of the wafer handling robot positioned in the transfer chamber. The robot of FIG. 1 is shown in greater detail in FIG. 2. As shown in FIG. 2, the magnetically coupled robot comprises a frog-leg type connection or arms between the magnetic clamps and the wafer blades to provide both radial and rotational movement of the robot blades in a fixed plane. Radial and rotational movements can be coordinated or combined in order to pick up, transfer, and deliver substrates from one location within the cluster tool to another, such as from one chamber to an adjacent chamber.

As the robot speed and acceleration increase, the amount of time spent handling each substrate and delivering each substrate to its next destination is decreased. However, the desire for speed must be balanced against the possibility of damaging the substrate or the films formed thereon. If a robot moves a substrate too abruptly, or rotates the wafer blade too fast, then the wafer may slide off the blade, potentially damaging both the wafer and the chamber or robot. Further, sliding movements of the substrate on the wafer blade may create particle contaminants which, if received on a substrate, can contaminate one or more die and, thereby, reduce the die yield from a substrate. In addition, movement of the substrate on the wafer blade may cause substantial misalignment of the substrate that may result in inaccurate processing or even additional particle generation when the substrate is later aligned on the support member in the chamber.

The robot blade is typically made with a wafer bridge on the distal end of the wafer blade that extends upwardly to restrain the wafer from slipping over the end. However, the wafer bridge does not extend around the sides of the blade and does very little to prevent the wafer from slipping laterally on the blade. Furthermore, the wafers are not always perfectly positioned against the bridge. Sudden movement or high rotational speeds may throw the wafer against the bridge and cause damage to the wafer or cause the wafer to slip over the bridge and/or off the blade.

There is a certain amount of friction that exists between the bottom surface of a wafer and the top surface of the wafer blade that resists slippage of the wafer. However, the bottom surface of a silicon wafer is very smooth and has a low coefficient of friction with the wafer blade, which is typically made of nickel plated aluminum, stainless steel or ceramic. Furthermore, a typical wafer is so lightweight that the total resistance due to friction is easily exceeded by the centrifugal forces applied during rapid rotation of the robot, even when the blade is in the fully retracted position. However, this low coefficient of friction is typically relied upon when determining the speed at which a robot rotates.

U.S. patent application Ser. No. 08/801,076, entitled "Mechanically Clamping Robot Wrist," filed on Feb. 14, 1997, now U.S. Pat. No. 5,750,642, which is hereby incorporated by reference discusses the problem of wafer slippage on a robot blade and the need to increase wafer transfer speeds. This application describes a clamping mechanism that holds the substrate on the blade during transfer. However, that invention is directed primarily to a standard system that moves a single wafer through the cluster tool.

There is a need for a robot that can transfer wafers at increased speeds and acceleration/decelerations, particularly in a multiple substrate processing system. More specifically, there is a need for a wafer clamping mechanism on a robot that can secure a pair of wafers on a pair of wafer blades with sufficient force to prevent wafer slippage and wafer damage during rapid rotation and radial movement. It would be desirable if the clamping mechanism minimized particle generation and/or wafer damage. It would further be desirable if the clamp would automatically engage the wafers except during full extension of the wafer blades when the blades are delivering or picking up wafers while also accommodating different robot extensions. Still further, it would be desirable to have a wafer gripper which is reliable for over 10 million plus cycles.

SUMMARY OF THE INVENTION

The present invention provides a clamp wrist and method of operation for selectively receiving a wafer on a wafer blade mounted to a robot arm. The clamp wrist comprises a translational member attached to the apogee end of the robot arm. A wrist housing of the clamp wrist is pivotally coupled to the apogee end of the robot arm. One or more clamp fingers movably attached to the wrist housing are urged against a workpiece that is resting on a wafer handling blade by a forward biasing member. A second biasing member connects the one or more clamp fingers to a contact pad movably connected to the wrist housing. The translational member is positioned and adapted to engage a contact pad and pull the contact pad away from the workpiece when the robot arm reaches a given degree of extension. The contact pad, which is also connected to the clamp fingers, pulls the clamp fingers away from the workpiece when the robot arm reaches a given degree of extension.

Another aspect of the invention provides a clamping mechanism for securing a workpiece to a workpiece handling member coupled to the distal, or apogee, end of a robot arm. The workpiece handling member comprises a wafer handling blade that has a workpiece receiving region and a retaining member at the distal end thereof. The clamping mechanism comprises clamp fingers for contacting the workpiece and a forward biasing member coupled to the clamp fingers that urges the one or more clamp fingers against the workpiece. A second biasing member coupled to the one or more clamp fingers is adapted to pull the finger away from the workpiece when the workpiece handling member is extended.

In yet another aspect of the invention, a robot arm assembly is provided that comprises a pair of frog-leg type robot arms that have a distal end with a clamp wrist attached thereto. The clamp wrist comprises a translational member attached to the distal end of each robot arm. A wrist housing is pivotally coupled to the robot arm and a contact pad is connected to the wrist housing. A forward biasing member coupled to the clamp fingers urges the clamp fingers against a workpiece. A second biasing member is connected to the clamp fingers and to the contact pad. The translational member is positioned and adapted to engage the contact pad and pull the contact pad away from the workpiece when the robot arm reaches a given degree of extension so that the contact pad and the second biasing member pull the clamp fingers away from the workpiece when the robot arm reaches a given degree of extension. This assembly can be adapted for both single wafer and multiple wafer robot transfer assemblies.

A further aspect of the invention provides a robot that comprises a pair of hub members rotatable about an axis and magnetically driven by a motor through an enclosure wall. A robot arm assembly is attached to each of the hub members. Each of the robot arm assemblies includes a first strut coupled to a hub member so that rotation of the hub member rotates the strut of each of the robot arm assemblies. Each of the robot arm assemblies also includes a second strut coupled to the end of the first strut. The two arm assemblies in combination cause two independent motions of the robot that include rotation of the robot about the axis of rotational symmetry and linear, radial extension of a robot arm from the axis of rotational symmetry. Attached to a distal end of each of the second struts is a translational member adapted to actuate the clamping mechanism. The robot includes two workpiece handling members. One of the workpiece handling members is pivotally attached to each of the arm assemblies, whereby one of the translational members and one of the arm assemblies corresponds to each of the workpiece handling members. The workpiece handling assembly comprises a forward biasing member coupled to at least one clamp finger for urging the clamp finger against a workpiece resting on the blade of the workpiece handling member. A second biasing member connects the clamp finger to the contact pad. To release the workpiece, the translational member is positioned and adapted to engage the contact pad and pull the contact pad away from the workpiece when the attached arm assembly reaches a given degree of extension. The contact pad and the second biasing member are adapted to pull the clamp fingers away from the workpiece when the attached arm assembly reaches a given degree of extension.

A further aspect of the invention provides a method for transferring a pair of workpieces using a pair of wafer handling blades on the distal end of a pair of robot arms. The method comprises the steps of extending the robot arms, biasing a clamping member coupled to each of the wafer handling blades to an open position upon a given amount of travel of relative motion between the robot arms and the wafer handling blades, placing a workpiece on each of the wafer handling blades of the extended robot arms, retracting the robot arms and biasing the clamping member to a clamped position upon a given amount of travel of relative motion between the robot arms and the wafer handling blades.

BRIEF DESCRIPTION OF THE DRAWINGS

So that the manner in which the above recited features, advantages and objects of the present invention are attained and can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments.

DETAILED DESCRIPTION OF THE PREFERRED EMBODIMENT

FIG. 1 shows a schematic diagram of an exemplary integrated cluster tool 400 useful for processing wafers 302 in tandem. Wafers 302 are introduced into and withdrawn from the cluster tool 400 through a loadlock chamber 402, typically an integral part of tool 400. A robot 10 having a pair of wafer handling blades 64 is located within the cluster tool 400 to transfer the substrates between the loadlock chamber 402 and the various process chambers 404. The robot arms 42 are illustrated in the retracted position for rotating freely within the transfer chamber 406. The specific configuration of the cluster tool in FIG. 1 is merely illustrative and the system shown is capable of processing two wafers 302 at one time. However, the invention is equally applicable to single wafer transfer or robot assemblies. In a preferred aspect of the invention, a microprocessor controller is provided to control the fabricating process sequence, conditions within the cluster tool, and operation of the robot 10.

FIG. 2 is a schematic view of a "frog-leg" type, magnetically-coupled robot 10 shown in a retracted position. The robot 10 comprises two concentric rings magnetically coupled to computer-controlled drive motors for rotating the rings about a common axis. The robot 10 includes a pair of robot arms 42 each including a first strut 44 rigidly connected to a first magnetic drive 20. A second strut 45 of the robot arm 42 is pivotally connected to the first strut 44 by an elbow pivot 46 and by a wrist pivot 50 to a workpiece handling member 60 and to a common rigid connecting member 190. The structure of struts, 44 and 45, and pivots, 46 and 50, form a "frog-leg" type robot arm robot arm 42 connecting the wafer handling members 60 to the magnetic drives 20.

When the magnetic drives 20 rotate in the same direction with the same angular velocity, the robot 10 also rotates about its rotational axis z, which is perpendicular to the plane of the diagram, in this same direction with the same angular velocity. When the magnetic drives 20 rotate in opposite directions with the same angular velocity, there is linear radial movement of the wafer handling members 60 to or from an extended position. The mode in which both motors rotate in the same direction at the same speed can be used to rotate the robot 10 from a position suitable for wafer exchange with one of the adjacent chambers to a position suitable for wafer exchange with another chamber. The mode in which both motors rotate with the same speed in opposite directions is then used to extend the wafer blade radially into one of the chambers and then extract it from that chamber. Some other combinations of motor rotation can be used to extend or retract the wafer blade as the robot is being rotated about axis x. A connecting member 190 attached at the pivot 50 to the second strut 45 and the workpiece handling members 60 extends between and connects the two workpiece handling members 60 and the robot arms 42. The assembly of connecting member 190 and workpiece handling member 60 is collectively referred to as the wrist 80. Movement of one arm assembly 42 relative to the support 190 is symmetrically duplicated by the other arm assembly 42 by means of a synchronization mechanism in connecting support 190, such as a gear or belt mechanism.

Figure 3:
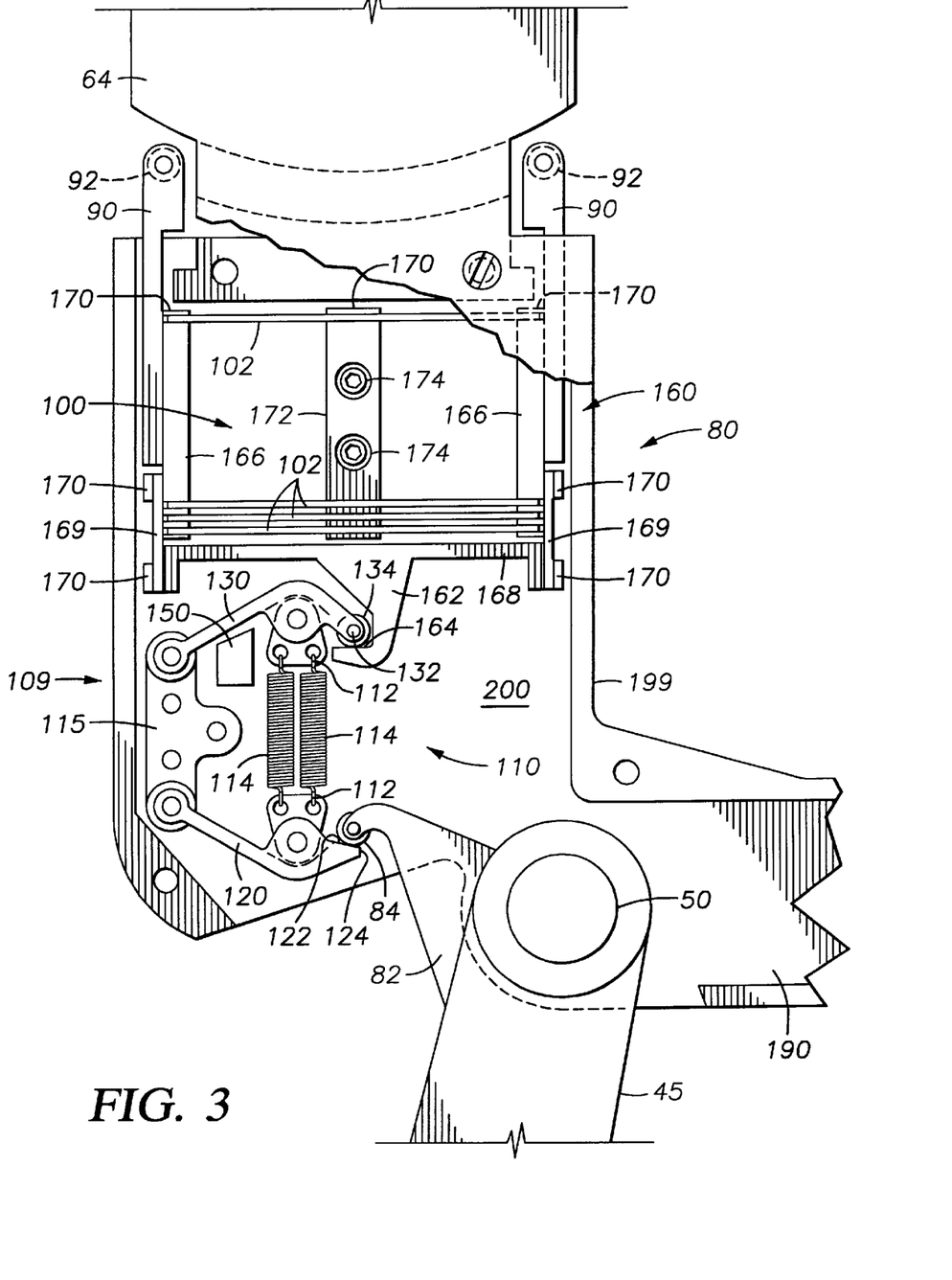
FIG. 3 is a bottom view of the clamp wrist assembly with the bottom cover plate partially removed.
Figure 4:
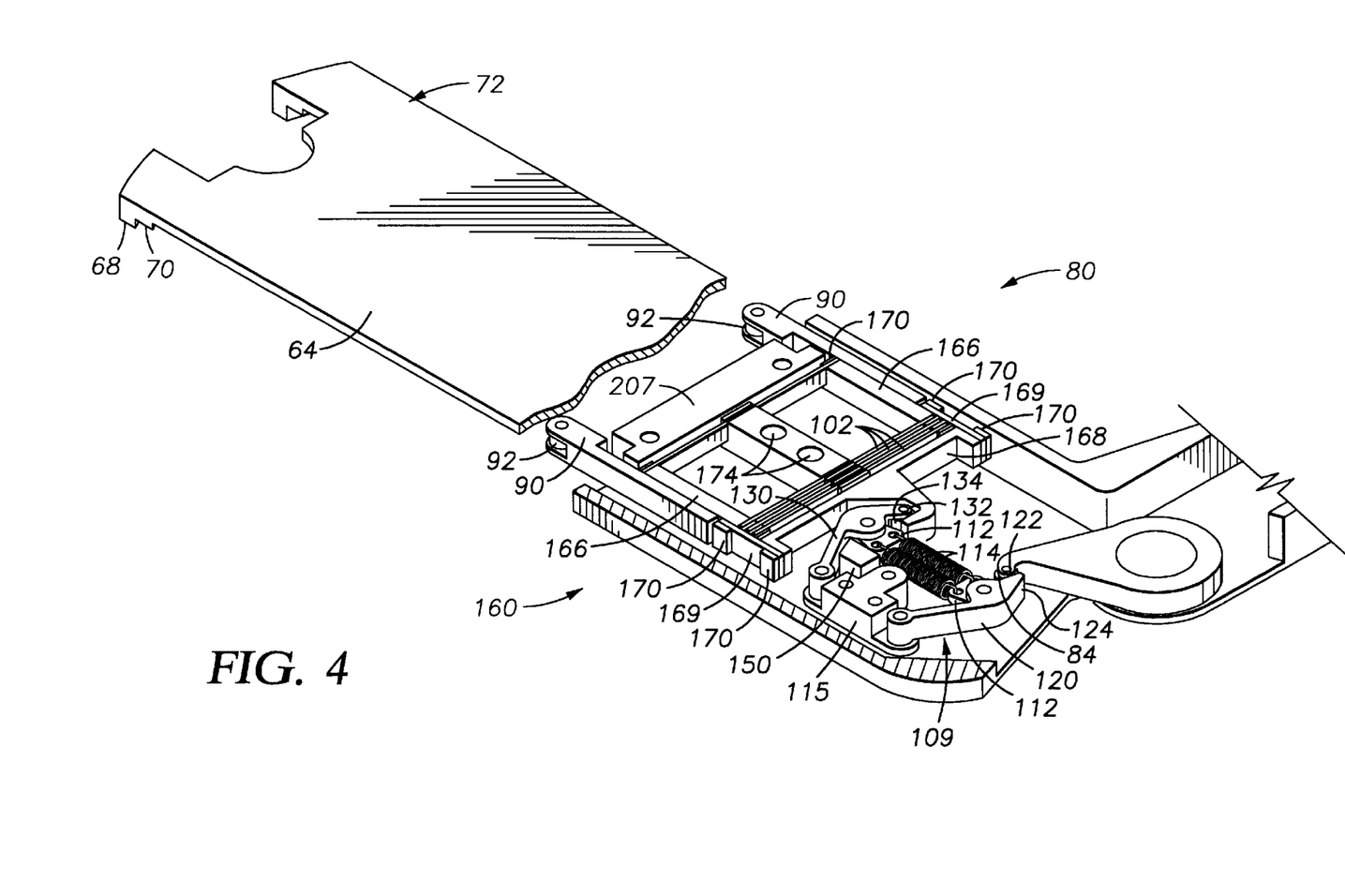
FIG. 4 is a partial perspective view of the clamp wrist assembly with the bottom cover plate removed.
Figure 5:
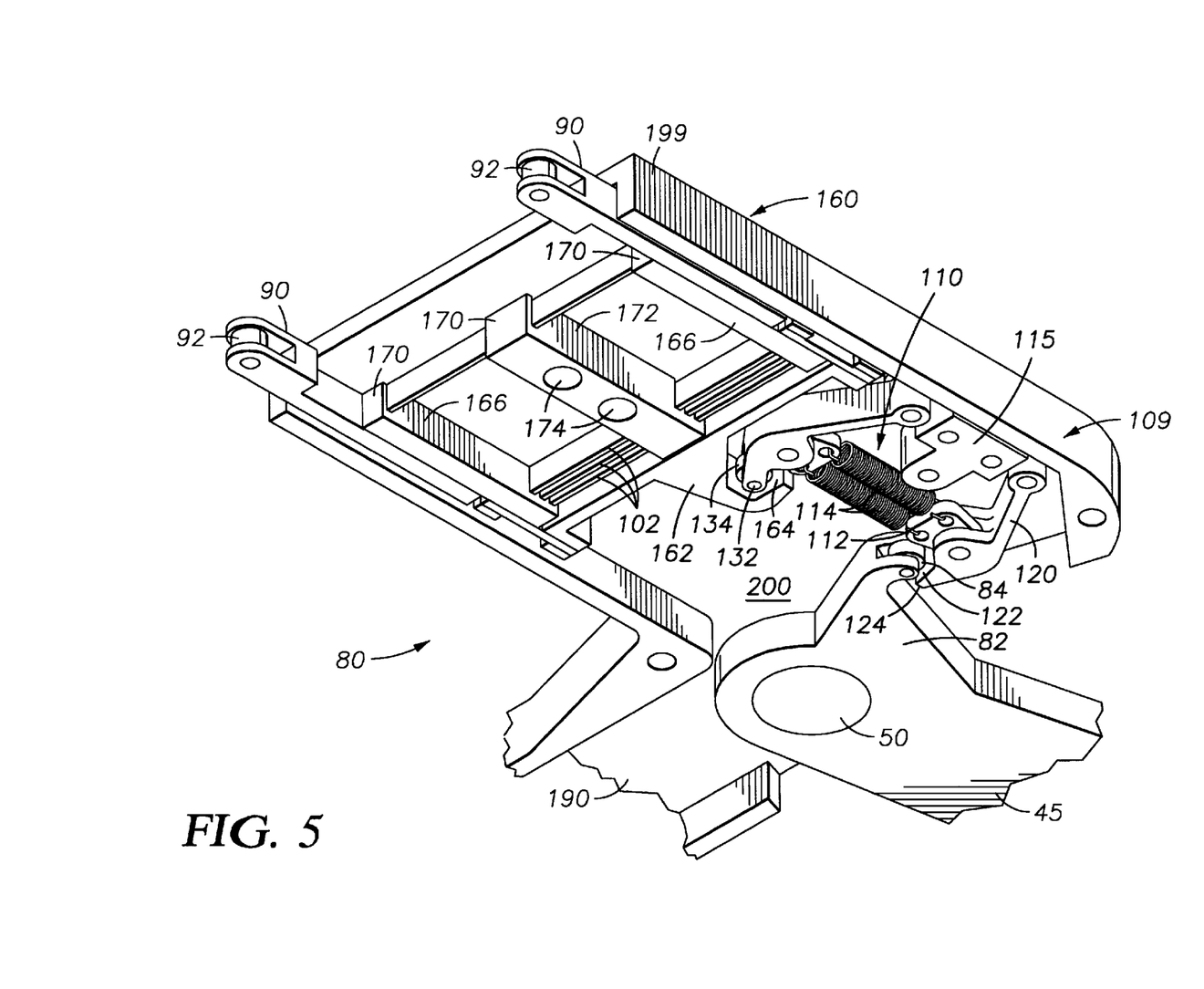
FIG. 5 is a partial perspective view of the wrist assembly with the bottom cover and wafer handling blade removed.

FIG. 3 shows a partial bottom view of the workpiece handling member 60 with the bottom cover plate partially removed. Clamp fingers 90 are shown in an extended clamping position. FIG. 4 shows a bottom perspective view of the workpiece handling member 60 with the bottom cover plate 202 removed. FIG. 5 shows a bottom perspective view of the workpiece handling member 60 with the bottom cover plate 202 and the handling blade 64 removed. Together, these figures illustrate the internal working components of the clamp wrist 80. The following discussion of the clamp wrist 80 refers generally to these three figures with specific reference to a particular figure when necessary.

Each of the workpiece handling members 60 has a wrist housing 199, a wafer handling blade 64 and a clamp wrist 80. The wrist housing 199 comprises a top cover plate 200 and a bottom cover plate 202 that encase the internal moving components of the workpiece handling member 60. The housing 199 is substantially rigid and is adapted to protect the workpiece handling member 60 components. The handling blade 64 extends from the forward end of the wrist housing 199 as an integral part thereof and is adapted to receive a wafer 302 thereon. A retaining member 70 (shown in FIG. 4) extends upwardly from the end of the wafer blade 64 opposite the wrist housing 199 at the distal end of the wafer handling blade 64, and is adapted to abut a wafer 302 disposed on the blade.

The clamp wrist of the workpiece handling member 60 is comprised of a lever assembly 109, a flexure member 160, and a pair of clamp fingers 90. The flexure member 160 generally comprises a frame, a forward biasing member 100, and a mount 172. Although the forward biasing member 100 may take any number of forms, the preferred embodiment uses a plurality of springs 102, preferably leaf springs, incorporated into the frame of the flexure member 160. The flexure member frame includes a connecting bar 168 at the back end of a pair of parallel side bars 166 that extends perpendicular to the side bars 166. Each of the opposing ends of the connecting bar 168 is attached to one of the rear ends of the side bars 166 by one or more resilient leaf springs 169. Spacers 170 mounted to the external surfaces of the leaf springs 169 capture and attach the leaf springs 169 to the side bar 166 and the connecting bar 168. The connecting bar 168 extends between and connects the side bars 166 to one another and allows a limited lateral flexibility of the flexure member 160.

The flexure member 160 preferably includes four leaf springs 102 extending between the side bars 166. To allow flexure of the leaf springs 102, the springs 102 have opposing ends that are attached to the side bars 166. Thus, the ends of the leaf springs 102 and the attached side bars 166 may move relative to the leaf spring centers intermediate the ends of the leaf springs 102. One of the leaf springs 102 is attached to the forward ends of the side bars 166 using a spacer 170 at each end to capture and attach the leaf spring 102 against the side bars 166. Likewise, the other three leaf springs 102 are attached to the back ends of the side bars 166 using spacers 170 to capture and attach the leaf springs against the ends of the side bars 166. The three leaf springs 102 attached to the back end side bars 166 are separated and spaced from one another by spacers 170. The leaf springs 102 are thin strips of resilient material that allow flexure in the forward and rearward direction.

The leaf springs 102 are attached to the mount 172 near the centers of the leaf springs 102. Spacers 170 capture and attach the leaf springs to the mount 172. As shown in FIGS. 3 and 5, the mount 172 includes a set of mounting holes 174 extending therethrough that are aligned with corresponding mounting holes in the top cover plate 200. A standard attachment member, such as a screw, is placed through the aligned mounting holes to secure the mount 172 to the top cover plate 200. Therefore, the mount 172 does not move relative to the wrist housing 199. However, the resilient leaf springs 102 bend and permit the side bars 166, attached to the ends of the leaf springs 102, and other flexure member frame components to move relative to the mount 172 and the wrist housing 199. When bent, the leaf springs 102 exert a force on the side bars 166 urging the side bars 166, and the flexure member 160, forward relative to wrist housing 199.

A yoke 162 is an integral part of connecting bar 168 at the rear of the flexure member 160 and extends rearward from the flexure member 160. The yoke 162 has a hook-like shape that defines a contact surface at the end of the yoke 162.

The two clamp fingers 90 are coupled to the side bars 166 of the flexure member 160 which maintains the clamp fingers 90 in spaced parallel alignment and provides for forward biasing of the clamp fingers 90. Each clamp finger 90 is attached to a side bar 166 and extends parallel thereto. The clamp fingers 90 extend an equal distance from the forward end of the flexure member 160 and the wrist housing 199 toward the wafer handling blade 64 so that, when the flexure member 160 is in the clamped position, the clamp fingers 90 engage the edge of the wafer 302. The distal ends of the clamp fingers 90 preferably include rollers 92 formed of a hard, wear-resistant material to minimize the friction between the clamp fingers 90 and the wafer 302 thereby minimizing particle generation.

The lever assembly 109 generally includes a mounting block 115, a pair of levers, 120 and 130, and a second biasing member 110. The mounting block 115 is fixedly attached to the top cover plate 200 and provides for pivotal mounting of the levers, 120 and 130.

The first lever 120 is an elongated lever having opposing ends. One end of the first lever 120 is pivotally connected to the mounting block 115. Opposite the pivotal connection end of the first lever 120, the apogee end 124 of the first lever 120 forms a relatively flat portion that defines a contact pad 122. Similarly, the second lever 130 is an elongated lever pivotally attached to the mounting block 115 and has an apogee end 132 opposite its pivot point. The first and second levers, 120 and 130, are mounted in spaced relation and are adapted to pivot in the same plane. The apogee end 132 of the second lever 130 is adapted and positioned to abut and maintain contact between the contact face 164 of the yoke 162 and the apogee end of the second lever 132 as the second lever 130 rotates in a rearward direction. To minimize the friction and resulting particle generation between the contact face 164 and the apogee end 132 of the second lever 130, the apogee end 132 of the second lever 130 preferably includes a contact roller 134 pivotally attached thereto that is formed of a hard, wear-resistant material.

Attached to the first lever 120, intermediate its opposing ends, is one end 112 of a second biasing member 110. The second biasing member 110 has opposing ends 112 and preferably is at least one spring 114. More preferably, however, the second biasing member 110 comprises two extension springs that extend between the first lever 120 and the second lever 130 biasing the levers toward one another. The second biasing member 110 is attached to the second lever 130 intermediate the ends of the second lever 130. As a result, pivotal movement of the first lever 120 causes pivotal movement of the second lever 130 toward the first lever 120. However, a stop member 150 comprising a fixed stop attached to the top cover plate 200 limits the rearward movement of the second lever 130 toward the first lever 120. The stop member 150 is adapted and positioned to prevent rearward motion of the second lever 130 beyond a predetermined position. This position is determined by the required rearward travel of the flexure member 160 and the clamp fingers 90. In some instances, the robot 10 must retrieve a misaligned wafer 302. The clamping mechanism serves to align these wafers 302 as it grips them on the handling blade 64. Thus, the clamp fingers 90 must sufficiently retract to allow a misaligned wafer 302 to be placed on the wafer blade 64. In the preferred embodiment, the stop member 150 is positioned to permit the clamp fingers 90 to retract up to 0.160 inches which will accommodate a wafer misalignment of up to 0.080 inches from center. The amount of retraction can be adjusted to accommodate tolerances in specific systems and is specifically limited in one embodiment to obtain substantial life from leafsprings 102. However, the amount of retraction can be any amount dictated by the particular system in which the clamping assembly is utilized.

A translational member 82 attached to the second strut 45 of the robot arm 42 is adapted to mate with and pull the moveable contact pad 122 of the first lever 120 rearwardly away from the wafer 302 at a given degree of robot arm extension. The translational member 82 is an elongated rigid member fixedly attached to the second strut 45 near the pivot 50 connecting the second strut 45 to the workpiece handling member 60. The translational member 82 extends outwardly from the second strut 45 into the wrist housing 199. Pivotally attached to an apogee end of the translational member 82 is a roller 84 adapted to abut another surface without generating substantial particles. The roller is preferably formed of a hard, wear-resistant material to minimize the friction between the translational member 82 and the contact pad 122. The translational member 82 is adapted and positioned so that its apogee end will abut the contact pad 122 of the first lever 120 as the apogee end of the translational member 82 rotates and moves rearward, away from the wafer 302 and the handling blade 64. Extension of the robot arm 42 causes a rearward rotation of the translational member 82.

Figure 6:
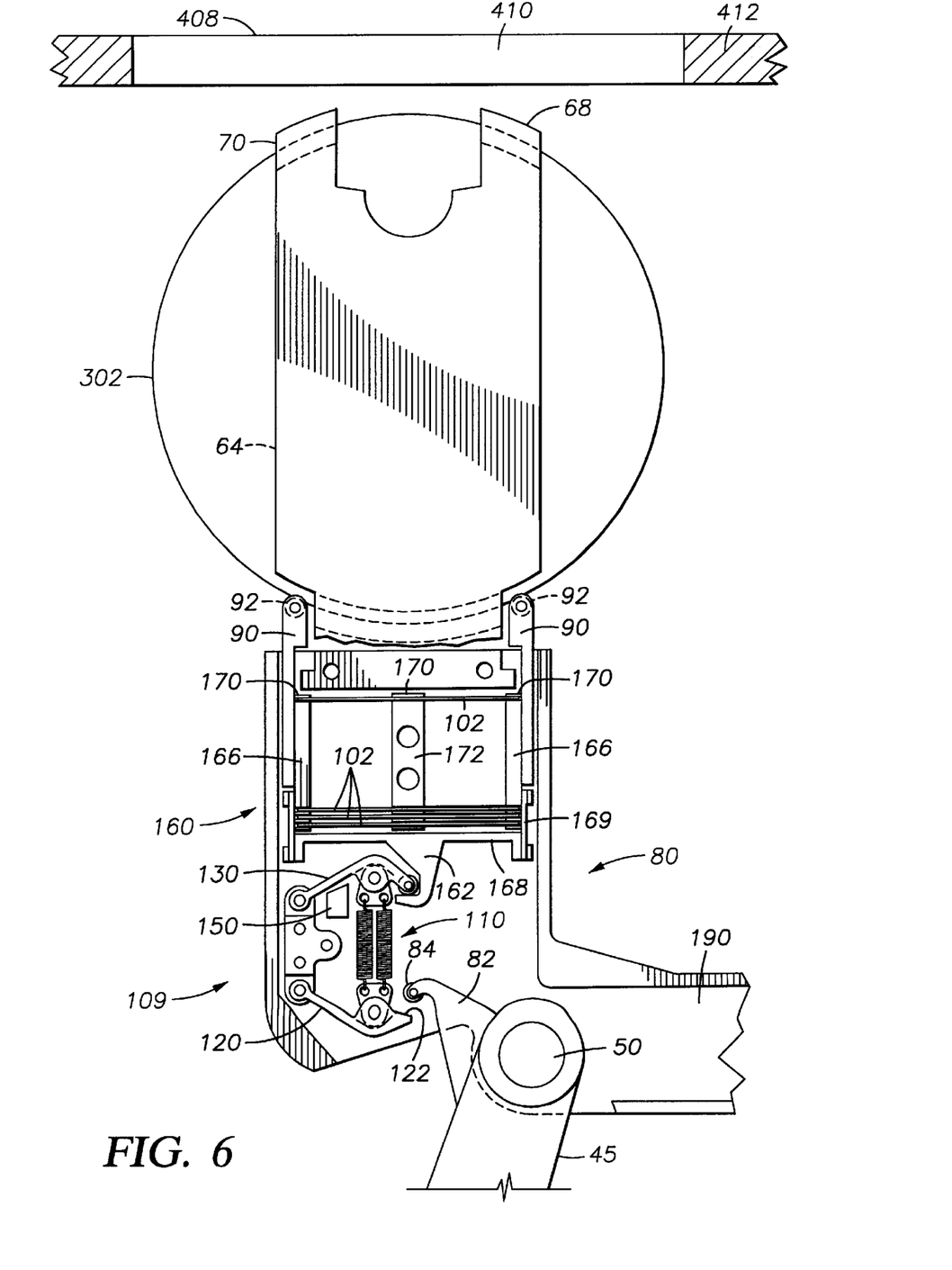
FIG. 6 is a partial top view of the wrist assembly showing the clamping mechanism in a clamped position.
Figure 7:
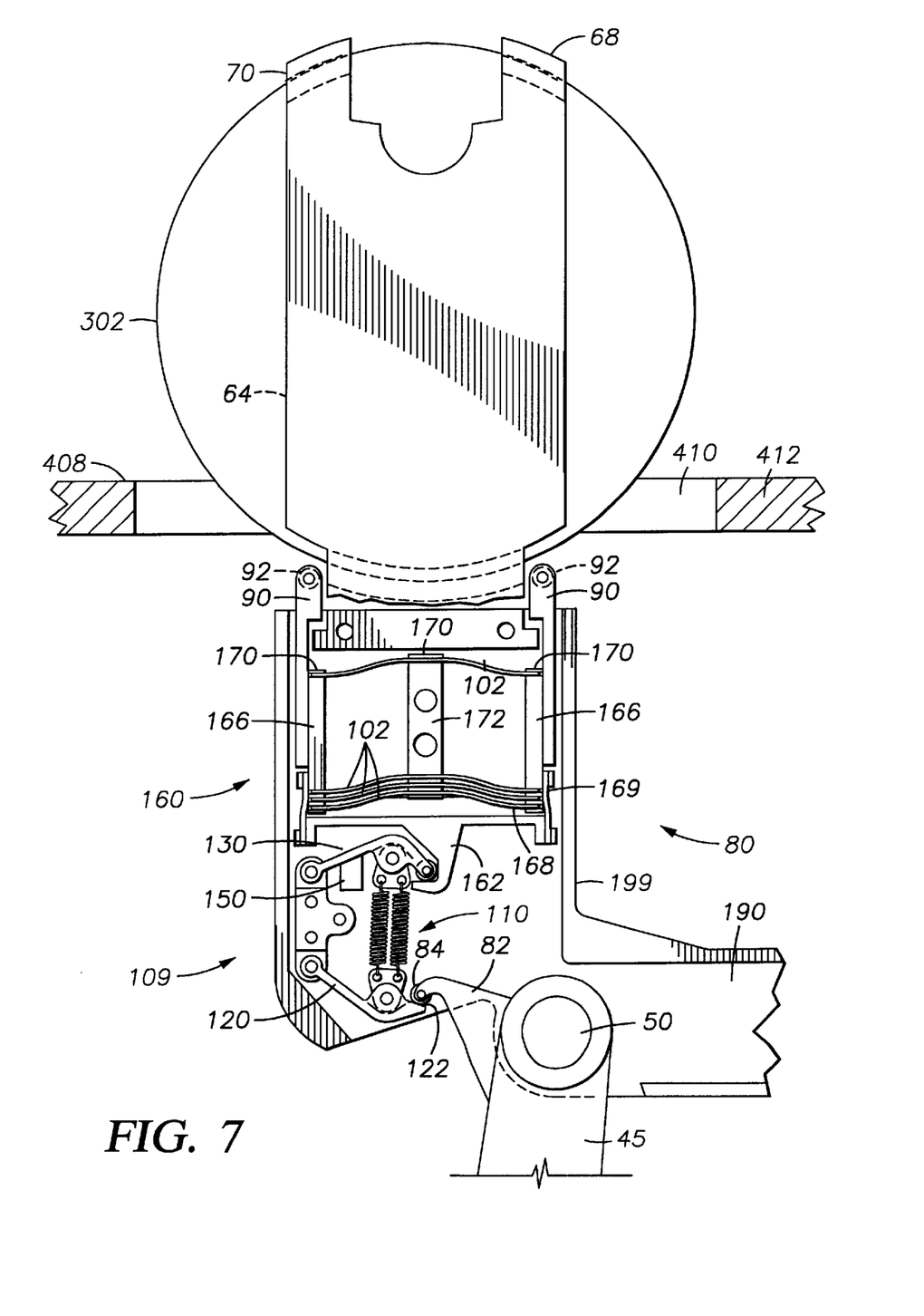
FIG. 7 is a partial top views of the wrist assembly showing the clamping mechanism in a released position near full extension.

FIGS. 6 and 7 are bottom views of the clamp wrist 80 with the bottom cover plate 202 removed and show the clamp wrist 80 operation with the robot arms 42 in a retracted and extended position, respectively. The comparison of the figures is useful to show how the clamp mechanism releases the wafer at full extension. FIG. 6 shows the wrist assembly 60 in a fully retracted position over the hub of the robot, such as when the assembly is in position for rotation. Note that the clamp fingers 90 are engaged against the perimeter of the wafer 302 in the clamped position. The engagement of the clamp fingers 90 not only clamps the wafer 302, but also consistently and accurately positions the wafer on the blade 64. Because the wafer 302 is accurately positioned, there are fewer handling errors and no need to use sophisticated wafer center finding equipment, although such equipment could still be used. Also note that when the wrist 80 is fully retracted, the proximal distance between the translational member 82 and the mating contact pad 122 is at a maximum.

FIG. 7 shows the blade 64 and wrist 80 extended through a wafer transfer slot 410 in a wall 412 of a chamber 404 to a point where the clamp is released. Note the gaps between the clamp fingers 90 and the edge of the wafer 302 that allow the wafer to be lifted from the top of the blade 64 by another apparatus, such as lift pins of a processing chamber (not shown). It is also instructive to note the relative positions of the translational member 82, the levers 120 and 130, the stop member 150, and the second biasing member 110. In this release position, the leaf springs 102 are bent.

Figure 8:
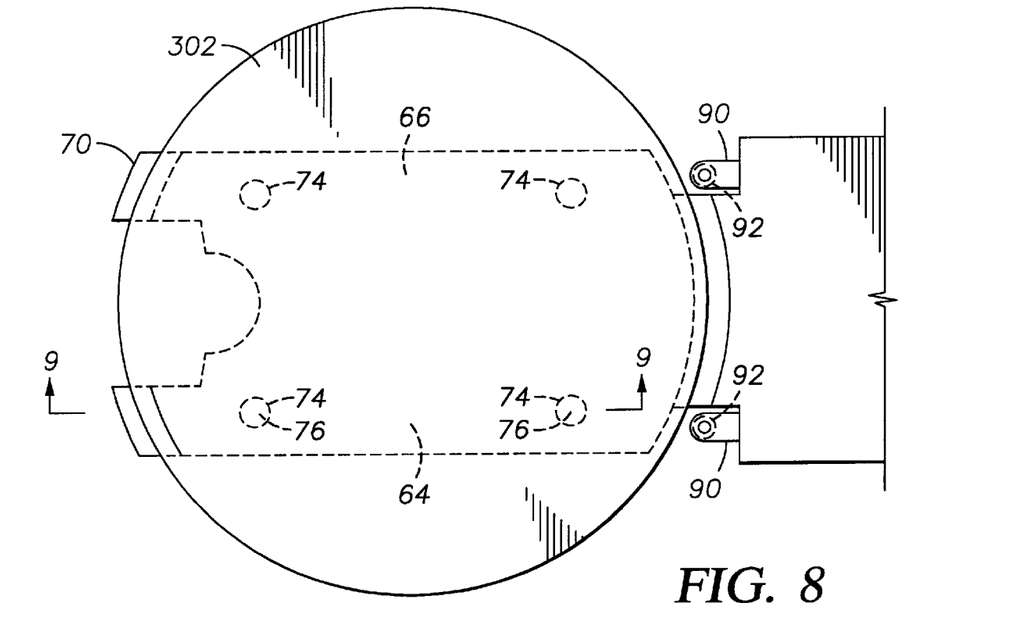
FIGS. 8 and 9 are top and cross sectional views of a wafer blade having a plurality of wafer support members.
Figure 9:
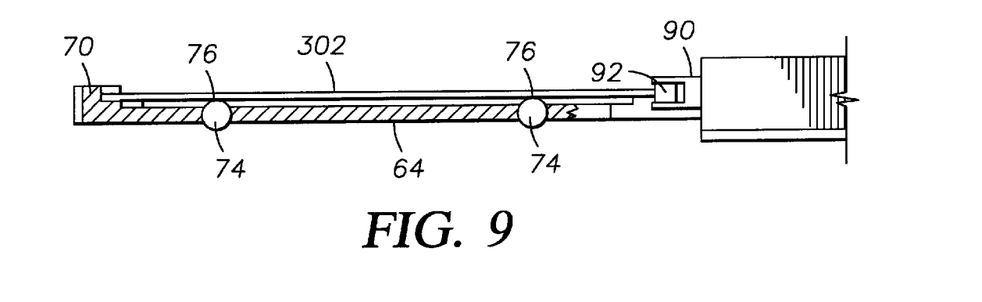

FIGS. 8 and 9 are top and side cross sectional views of a wafer blade 64 having a plurality of wafer support members 74. The wafer support members 74 are coupled to, or integrally formed in, the wafer blade 64 and have a wafer contact surface 76 that extends upward a sufficient distance above the top surface of the wafer blade 64 to prevent the bottom surface of the wafer 302 from contacting the top surface. In this manner, the wafer support members 74 reduce the degree to which the bottom surface of the wafer 302 is contacted and rubbed, thereby decreasing the likelihood or degree of particle generation and/or wafer damage.

Although a wafer could be supported on as few as three wafer support members 74, it is preferred that the wafer blade 64 include at least four wafer support members 74. It is also generally preferred that the wafer support members 74 be spread out by as great a distance as is practical in order to provide stability to the wafer 302 received thereon, even though additional stability will be provided when the wafer is clamped. A plurality of support members 74 which preferably have a convex surface with a large radius reduce the contact pressure with the underside surface of the wafer 302 thereby further reducing the possibility of particle generation.

While the support members 74 may be made from any material, it is generally desirable to select a material that does not corrode in the process environment, erode or generate particles therefrom, and does not damage the wafer surface. Materials preferred for use as support members include alumina, blue sapphire, zirconia, silicon nitride and silicon carbide. The support members 74 may also be made from a machined metal having a ceramic, sapphire or diamond coating disposed thereon.

Figure 10A:
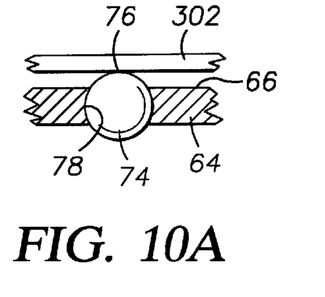
FIG. 10A is a magnified partial cross sectional view of the wafer blade and a wafer support member as indicated in FIG. 9.

FIG. 10A is a magnified partial cross sectional view of the wafer blade 64 and a wafer support member 74 as indicated in FIG. 9. The support member 74 in FIG. 10A is shown as a ball bearing that can rotate within bearing surface 78. Because the bearings are free to rotate or roll, the degree of friction between the member 74 and the wafer 302 may be further reduced or eliminated.

Figure 10B:
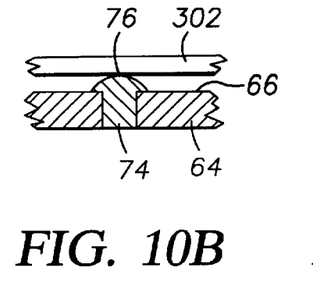
FIGS. 10B and 10C are magnified partial cross sectional views of alternate wafer support members that may be used instead of, or in combination with, the wafer support member of FIG. 10A.
Figure 10C:
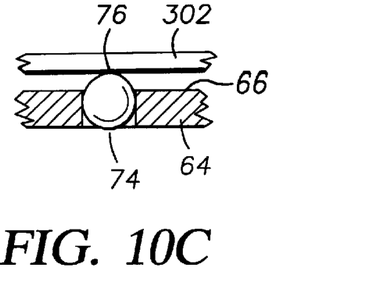

FIGS. 10B and 10C are partial cross sectional views of alternative support members 74 that may be used instead of or in combination with the support member 74 shown in FIG. 10 A. The support member 74 of FIG. 10B comprises a post that is rigidly received within a hole in the blade 64 and a semi-spherical button which forms the top surface 76 that contacts the wafer 302. The support member 74 of FIG. 10C is a ball or sphere that is rigidly secured within a hole in the blade so that the top surface 76 extends slightly above the top surface 66 of the blade 64. Each of the designs in FIGS. 10A, 10B, and 10C or their equivalents may be used alone or in combination to provide support for the wafer 302.

METHOD OF OPERATION

In operation, the robot 10 rotates about its axis within the transfer chamber 406 to align the wafer handling members 60 with the various chambers 404 attached to the transfer chamber 406. Once aligned with a chamber 402 and 404, the robot arms 42 extend, by relative rotation of the first and second struts, 44 and 45, moving the wafer handling member 60 and the wafers 302 resting thereon into the chamber 404 for transfer. To facilitate faster transfer of the wafers 302 between the chambers 404, the wafers 302 are clamped on the wafer handling members 60 when resting thereon. The clamp wrist 80 used to facilitate this clamping operates as follows. Please note that the following description refers to only a single robot arm 42, clamp wrist 80, and workpiece handling blade 64 for ease of description.

During wafer transfer on the wafer handling member 60, the flexure member 160 biases the clamp fingers 90 into the clamping position. This biasing is supplied by the resilient leaf springs 102 of the flexure member 160. When bent, the centers of the leaf springs 102, which are attached to the mount 172, remain stationary while the ends of the leaf springs 102 move with the side bars 166. Therefore, only when a sufficient force is applied to the flexure member 160 will the side bars 166 of the flexure member 160, as well as the attached clamp fingers 90, move while the mount 172 remains fixed. This movement causes the resilient leaf springs 102 to bend and exert a force opposing the movement. In the preferred embodiment, the bending of the leaf springs 102 exerts a clamping force on the wafer 302 of approximately 0.14 pounds, or about 1.2 times the weight of the wafer 302. Because the size of the wafers 302 is substantially constant, the forward, clamping position of the clamp fingers 90 does not need to change. Thus, the clamp wrist 80 limits the forward travel of the flexure member 160. Any accidental forward travel of the flexure member 160 beyond the clamping position is arrested by spacers 170 when they contact the forward blade mount 207. Using the flexure member 160 described, which connects the two contact fingers 90 associated with each wafer 302, both of the clamp fingers 90 can be retracted using the motion of a single robot arm 42.

Accordingly, the flexure member 160 biases the clamp fingers 90 to a forward, clamped position into contact with a wafer 302 on the wafer handling blade 64. However, in order to place the wafer 302 on and remove the wafer 302 from the wafer handling blade 64, the clamping action must be released and the clamping fingers 90 retracted. The majority of the time that the wafer 302 is on the blade 64 the robot 10 is moving the wafer 302. To maximize the efficiency of the robot transfer, the wafer 302 is clamped as long as possible while it is on the handling blade 64 so that the robot 10 can use higher velocities and greater accelerations and decelerations to move the wafer 302 faster. Therefore, the clamping force is released only to accomplish wafer transfer between the wafer handling blade 64 and the chamber 404. As such, the clamping force is released only when the robot arms 42 are extended into the chamber 404 to complete the transfer.

As the robot arms 42 extend into the chamber 404 to complete the transfer between the robot 10 and the chamber 404, the struts, 44 and 45, rotate relative to the workpiece handling member 60. This rotation of the second strut 45 causes a rotation of the translational member 82 fixedly attached thereto. The translational member 82 is positioned and adapted so that, when the second strut 45 reaches a predetermined degree of rotation which translates to a given extension of the robot arms 42, the roller 84 attached to the apogee end of the translational member 82 contacts the contact pad 122 of the first lever 120 causing a rearward pivot of the first lever 120 on continued extension of the robot arm 42. Accordingly, the translational member 82 translates the extending motion of the robot arm 42, and the rotational motion of the struts, 44 and 45, into a rearward rotation of the first lever 120. The first lever 120 then pulls the attached pair of extension springs rearward which biases the second lever 130 rearward causing rearward rotation of the second lever 130. As the second lever 130 rotates rearward, it contacts a contact face 164 of the yoke 162 attached to the flexure member 160 pulling the flexure member 160 and the attached contact fingers 90 away from the wafer 302 and the handling blade 64. The wafer 302 may then be removed from the wafer handling blade 64. The subsequent retraction of the robot arms 42 causes the translational member 82 to disengage the first lever 120, releasing the force of the second biasing member 110, and allowing the flexure member 160 to return the clamp fingers 90 to the clamped position and causing the clamp fingers 90 to engage the edge of the wafer 302 resting on the wafer handling blade 64, thereby pressing the wafer 302 against the retaining member 70. The leaf springs 102 bias the flexure member 160 to the clamped position. By biasing the wafer 302 against a retaining member 70 fixed to the handling blade 64, the clamping fingers 90 align the wafer 302 to the same position each time a wafer 302 is placed on the handling member 64 and, thereby, increase the repeatability of the system.

Before reaching the position where the clamp fingers 90 retract, the robot movement is slowed to avoid any movement of the wafer 302 on the wafer handling blade 64. When clamped, however, the robot movement speeds, accelerations, and decelerations are limited only by the robot movement capabilities.

One important design consideration of the present invention is that, in some cluster tools 400, as in the one shown in FIG. 1, the processing chambers 404 and the loadlock chamber 402 may or may not be the same distance from the axis x of the robot 10. The present invention accommodates this difference by the use of the springs 114 and the stop member 150 (FIGS. 3 and 5). As the second biasing member 110 biases the second lever 130 rearward, upon reaching a given rearward position, the second lever 130 contacts the stop member 150 which prevents further rearward travel of the second lever 130. However, by using extension springs, the first lever 120 may continue to move rearward and the extension springs will absorb this "lost motion" due to their resilient ability to lengthen. In the preferred embodiment, at fall extension, the force exerted by the extension springs between the levers, 120 and 130, is preferably less than about 0.5 lbs.

The exact point at which the clamping mechanism releases the wafer 302 is dependent upon, and may be determined by, the relative sizes and positioning of the various components. For example, the angle at which the translational member 82 is attached to the second strut 45 and the relative position of the contact pad 122 determine the relative position at which they contact one another. The relative lengths of the struts, 44 and 45, determine the relative rotation of the second strut 45 to the workpiece handling member 60. Because the clamp fingers 90 retract at a given relative angle between the second strut 45 and the workpiece handling member 60, the lengths of the struts, 44 and 45, must be such that the angle is reached only when the robot arms 42 are extended. Other factors that may affect the point at which the clamping fingers 90 retract include the tension of the spring 114 and the relative positions of the first lever 120, the second lever 130, and the contact face 164. In the preferred embodiment, these components are adapted so that the clamp fingers 90 retract when the wafer handling blade 64 is within 1 to 3 inches of the transfer position (i.e., the fully extended position).

When the clamp fingers 90 engage the wafer 302, the wafer 302, is secured between the fingers 90 and the retaining member 70, then the engagement of the clamp fingers 90 will push the wafer 302 until it moves against the retaining member 70. It is during this movement of the wafer 302 relative to the wafer blade 64 that the bottom surface of the wafer 302 will encounter any frictional forces with the wafer contact surface 76 of the wafer support members 74. However, unlike support members of conventional blades which contact the wafer 302 over a large area, the support members of the present invention reduce or minimize the degree of contact and friction therebetween and, thereby, reduce or eliminate wafer damage or particle generation. Consequently, the wafer support members 74 of the present invention are not relied on to provide friction, but rather to reduce friction and damage to the wafer 302. It is the clamping action of the present invention that holds the wafer 302 in place during movement of the blade 64.

While the foregoing is directed to the preferred embodiment of the present invention, other and further embodiments of the invention may be devised without departing from the basic scope thereof, and the scope thereof is determined by the claims which follow.

What is claimed is:

1. An apparatus, comprising:
   a) a robot assembly having at least one arm and one or more actuators coupled to the arm;
   b) a first wrist housing pivotally coupled to the at least one arm;
   c) at least one clamp finger movably disposed in the first wrist housing;
   d) a first biasing member coupled to the at least one clamp finger for urging a distal end of the at least one clamp finger linearly outwardly from the first wrist housing;
   e) a lever assembly disposed in the wrist housing and connected to the at least one clamp finger, wherein the lever assembly is adapted to urge the distal end of the at least one clamp finger linearly inwardly to the first wrist housing upon actuation of the lever assembly; and
   f) a translational member disposed on the arm adapted to actuate the lever assembly upon a given degree of extension of the at least one arm.

2. The apparatus of claim 1 wherein the lever assembly comprises
   a contact pad movably connected to the first wrist housing wherein the translational member is positioned to selectively engage the contact pad when the arm reaches the given degree of extension.

3. The apparatus of claim 2 wherein the lever assembly comprises a second biasing member connecting the at least one clamp finger to the contact pad.

4. The apparatus of claim 1 wherein the first biasing member includes a leaf spring.

5. The apparatus of claim 3 wherein the second biasing member is at least one extension spring.

6. The apparatus of claim 3 further comprising a yoke coupled to the at least one clamp finder and wherein the lever assembly comprises:
   g) a first lever pivotally mounted to the first wrist housing and having the contact pad coupled to one end thereof; and
   h) a second lever pivotally mounted to the first wrist housing in spaced relation to the first lever; wherein the second biasing member couples the first lever and the second lever to one another; and wherein the second lever is positioned to actuate the yoke when the at least one arm reaches the given degree of extension.

7. The apparatus of claim 6 further comprising:
   i) a stop member attached to the first wrist housing and adapted and positioned to limit the movement of the lever assembly.

8. The apparatus of claim 1 wherein the first biasing member is a component of a flexure member slidably disposed in the first wrist housing and wherein the at least one clamp finger comprises two clamp fingers mounted on the flexure member in fixed spaced relation to one another.

9. The apparatus of claim 1 further comprising:
   g) a connecting member coupled to the first wrist housing and to a second wrist housing.

10. A clamping mechanism for securing a workpiece, comprising:
    a) a robot arm;
    b) a workpiece handling member coupled to a distal end of the robot arm and comprising a wafer handling blade having a workpiece receiving region and a retaining member at a distal end of the wafer handling blade;
    c) at least one clamp finger disposed on the workpiece handling member to selectively contact the edge of the workpiece while the workpiece is disposed in the workpiece receiving region;
    d) a first biasing member coupled to the at least one clamp finger to urge the at least one clamp finger linearly outward from the workpiece handling member against the workpiece when the workpiece is positioned on the workpiece receiving region;
    e) a lever assembly disposed on the workpiece handling member and connected to the at least one clamp finger, wherein the lever assembly is adapted to urge the at least one clamp finger linearly away from the workpiece upon actuation; and
    f) a translational member disposed on the arm, wherein the translational member is adapted to actuate the lever assembly on a given degree of extension of the robot arm.

11. The clamping mechanism of claim 10 wherein the first biasing member comprises one or more leaf springs.

12. The clamping mechanism of claim 10 further comprising a flexure member slidably disposed on the workpiece handling member and comprising the first biasing member and connected to the at least one clamping finger, wherein the clamping mechanism further comprises a yoke coupled to the flexure member and to the lever assembly.

13. The clamping mechanism of claim 12, wherein the lever assembly comprises:
    e) a first lever pivotally mounted to the workpiece handling member and having an apogee end;
    f) a contact pad disposed at the apogee end and wherein the translational member is positioned and adapted to engage the contact pad when the robot arm reaches the given degree of extension;
    g) a second lever pivotally mounted to the workpiece handling member in spaced relation to the first lever and connected to the first lever by a second biasing member;
    wherein a portion of the second lever is disposed on the yoke and is positioned to actuate the yoke away from the workpiece when the robot arm reaches the given degree of extension.

14. The clamping mechanism of claim 13 further comprising a stop member attached to the workpiece handling member positioned to limit the movement of the second lever.

15. The clamping mechanism of claim 10 further comprising two clamp fingers mounted on a flexure member in fixed spaced relation to one another.

16. A robot arm assembly, comprising:
    a) a pair of frog-leg type robot arms, each arm having a distal end with a translational member and a clamp wrist attached thereto, each clamp wrist comprising:
       i) a wrist housing pivotally coupled to the robot arm;
       ii) a blade connected to the wrist housing and adapted to support a workpiece and having a workpiece retaining member at a distal end;
       iii) at least one linearly movable clamp finger disposed in the wrist housing;
       iv) a first biasing member coupled to the at least one clamp finger to urge the at least one clamp finger toward the retaining member
       v) a first lever movably connected to the wrist housing; and
       vi) a second biasing member connecting the at least one clamp finger to the first lever;
    wherein the translational member is adapted to engage the first lever on a given degree of extension of the robot arms to urge the at least one clamp finger away from the retaining member.

17. The robot arm assembly of claim 16 further comprising a roller pivotally attached to the end of each of the at least one clamp finger.

18. The robot arm assembly of claim 16 wherein each clamp wrist further comprises:
    viii) a second lever pivotally mounted to the wrist housing in spaced relation to the first lever; wherein the second biasing member is connectedly disposed between the first lever and the second lever; and
    ix) a yoke coupled to the at least one clamping finger; wherein the second lever has an apogee end to actuate the yoke and the at least one clamp finger away from the workpiece when the robot arm reaches the given degree of extension.

19. The robot arm assembly of claim 18 further comprising a stop member attached to the wrist housing positioned to limit the movement of the second lever away from the workpiece.

20. The robot arm assembly of claim 16 further comprising a connecting member coupled to and extending between the wrist housings of the robot arm assembly.

21. A robot, comprising:
    a) a pair of hub members rotatable about a first axis;
    b) a pair of magnetic drives for driving each of the hub members;
    c) a pair of robot arms, each robot arm comprising a first and second strut coupled to one another, the first strut mounted to a hub member;
    d) a translational member disposed on each of the second struts; and
    e) a workpiece handling member pivotally attached to the pair of robot arms, the workpiece handling member comprising:
       i) a wrist housing;
       ii) at least one clamp finger at least partially disposed in the wrist housing;
       iii) a contact pad movably disposed on the wrist housing;
       iv) a first biasing member coupled to the at least one clamp finger adapted to urge the at least one clamp finger against a workpiece; and
       v) a second biasing member connecting the at least one clamp finger to the contact pad;

wherein the translational member actuates the contact pad away from the workpiece when the attached arm assembly reaches a given degree of extension; and the contact pad and the second biasing member are adapted to pull the at least one clamp finger away from the workpiece when the attached arm assembly reaches a given degree of extension.

22. The robot of claim 21 wherein the second biasing member is at least one spring.

23. The robot of claim 21 wherein workpiece handling member further comprises:

f) a first lever pivotally mounted to the wrist housing, the first lever having the contact pad disposed thereon;

g) a second lever pivotally mounted to the wrist housing in spaced relation to the first lever; wherein the second biasing member is connectedly disposed between the first lever and the second lever;

h) a yoke coupled to the at least one clamping finger; wherein the second lever is positioned to actuate the yoke away from the workpiece when the robot at reaches a given degree of extension.

24. The robot of claim 23 further comprising:

i) a stop member attached to the wrist housing positioned to limit the movement of the second lever away from the workpiece.

25. The robot of claim 21 wherein the first biasing member is a component of a flexure member slidably disposed in the wrist housing and the at least one clamp finger comprises two clamp fingers mounted on the flexure member in spaced relation to one another.

26. A method for operating two or more wafer handling blades adapted to transfer two or more workpieces wherein the two or more wafer handling blades are each mounted on distal ends of two or more robot arms coupled by a connecting member, and wherein each of the two or more wafer handling blades comprise a clamping member assembly including one or more clamping fingers, the method comprising:

a) extending the robot arms to actuate a translational member disposed on each of the distal ends in a first direction;

b) biasing, with the translational member, a lever assembly disposed on each of the two or more wafer handling blades and connected to a respective clamping member assembly;

c) actuating, in a first linear direction, each of the one or more clamping fingers upon biasing the respective lever assembly;

d) retracing the robot arms to actuate each translational member in a second direction opposite the first direction to relieve the bias on each lever assembly provided by the respective translational member; and e) actuating, in a second linear direction opposite the first linear direction, each of the one or more clamping fingers under a biasing force provided by a biasing member of the the clamp member assembly.

27. The method of claim 26, further comprising contacting an edge of the workpieces on the wafer handling blades with each of the one or more clamping fingers during step d).

28. The method of claim 27 further comprising rotating the robot while the workpieces are clamped.

29. The method of claim 26, wherein extending the robot arms comprises rotating the pair of robot arms in a same direction and wherein retracting the robot arms comprises rotating the pair of robot arms in an opposite direction.

* * * * *

UNITED STATES PATENT AND TRADEMARK OFFICE
CERTIFICATE OF CORRECTION

PATENT NO. : 6,155,773
DATED : December 5, 2000
INVENTOR(S) : Ebbing et al.

It is certified that error appears in the above-identified patent and that said Letters Patent is hereby corrected as shown below:

Column 5,
Line 13, please insert "The present invention generally provides a robot 10 that can transfer wafers 302 at increased speeds and accelerations and decelerations. More particularly, the present invention provides a robot clamp wrist 80 for mechanically clamping a pair of wafers 302 (or other workpiece) to a pair of wafer handling members 60 mounted on robot arms 42. The clamping wrist selectively applies sufficient force to prevent wafer slippage and wafer damage during rapid rotation and linear movement of the blade 64 while allowing transfer of the wafer 302 to be accomplished on extension. The clamping wrist biases the wafer 302 on the blade against a retaining member 70 during a specific range of arm extension and/or retraction. In one embodiment, the clamping wrist uses two clamp fingers 90 on" "each blade (if a dual blade robot is used) to position and hold the wafer 302 with minimal particle generation and wafer damage. The clamp is designed so that wafers 302 are normally clamped except when the wafer blade 64 is near full extension while delivering or picking up a wafer 302. However, because the chambers may be positioned at different distances from the axis of the robot 10, the clamp is designed to release the wafer 302 in a predetermined range of extension to accommodate any discrepancy in delivery distance."

Column 8,
Line 52, after "the", please insert "clamp".
Line 52, after "wrist", please delete "assembly 60" and insert "80".
Line 53, after "position", please delete "over the hub of the robot,".

Signed and Sealed this

Twenty-third Day of October, 2001

Attest:

Attesting Officer

NICHOLAS P. GODICI
Acting Director of the United States Patent and Trademark Office